(12) United States Patent
Khaselev et al.

(10) Patent No.: US 9,362,424 B2
(45) Date of Patent: Jun. 7, 2016

(54) ELECTRICAL CONTACTS

(76) Inventors: Oscar Khaselev, Monmouth Junction, NJ (US); Nitin Desai, Princeton Junction, NJ (US); Michael T. Marczi, Chester, NJ (US); Bawa Singh, Voorhees, NJ (US)

( * ) Notice: Subject to any disclaimer, the term of this patent is extended or adjusted under 35 U.S.C. 154(b) by 987 days.

(21) Appl. No.: 12/052,104

(22) Filed: Mar. 20, 2008

(65) Prior Publication Data
US 2008/0245765 A1 Oct. 9, 2008

Related U.S. Application Data

(60) Provisional application No. 60/908,873, filed on Mar. 29, 2007.

(51) Int. Cl.
*H01L 31/0224* (2006.01)
*H01L 31/18* (2006.01)
*H05K 3/00* (2006.01)

(52) U.S. Cl.
CPC ........ *H01L 31/022425* (2013.01); *H01L 31/18* (2013.01); *H05K 3/002* (2013.01); *H05K 2203/0793* (2013.01); *Y02E 10/50* (2013.01)

(58) Field of Classification Search
USPC .......................................................... 427/74
See application file for complete search history.

(56) References Cited

U.S. PATENT DOCUMENTS

| | | | | |
|---|---|---|---|---|
| 4,872,925 A | * | 10/1989 | McMaster | 136/244 |
| 6,093,882 A | * | 7/2000 | Arimoto | 136/252 |
| 6,461,936 B1 | * | 10/2002 | von Ehrenwall | 438/424 |
| 2002/0030178 A1 | | 3/2002 | Samukawa | |
| 2007/0007627 A1 | * | 1/2007 | Young et al. | 257/623 |
| 2008/0152835 A1 | * | 6/2008 | Mayers et al. | 427/532 |
| 2010/0032011 A1 | * | 2/2010 | Sauar | 136/256 |

FOREIGN PATENT DOCUMENTS

| | | |
|---|---|---|
| DE | 101 50 040 A1 | 4/2003 |
| DE | 10 2005 007743 A1 | 7/2006 |
| WO | 2005024920 A1 | 3/2005 |

OTHER PUBLICATIONS

Machine Translation of DE 10 2005 007743 A1.*
Lennon, Alison J. et al., "Direct Patterned Etching of Silicon Dioxide and Silicon Nitride Dielectric Layers by Inkjet Printing", Sp;ar Energy Materials & Solar Cells, vol. 93, No. 10, Oct. 1, 2009, pp. 1865-1874.
Kopylova, V.P. et al., "Chemical Stability of Silicon Nitride and Oxynitride Powders", Powder Metallurgy and Metal Ceramics, vol. 14, No. 10, Dec. 13, 2004, pp. 812-816.

* cited by examiner

*Primary Examiner* — Nadine Norton
*Assistant Examiner* — Bradford Gates
(74) *Attorney, Agent, or Firm* — Carmody Torrance Sandak & Hennessey LLP

(57) ABSTRACT

Certain embodiments are directed to methods, devices and systems designed to remove selected portions of a material to expose an underlying material or substrate. One or more electrical components may be coupled to the underlying substrate through an electrical contact. Kits and systems for producing electrical contacts are also provided.

16 Claims, 8 Drawing Sheets

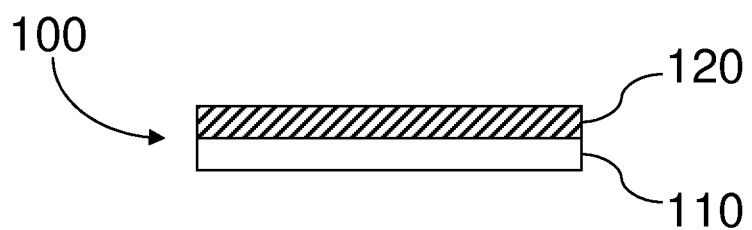
FIG. 1A
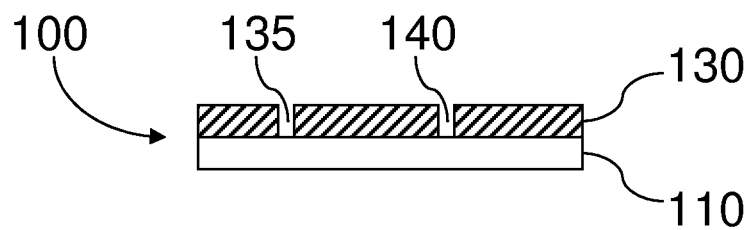
FIG. 1B

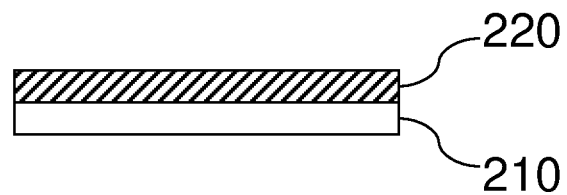
FIG. 2A
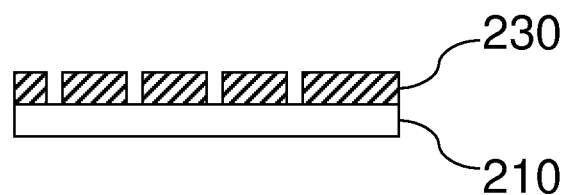
FIG. 2B
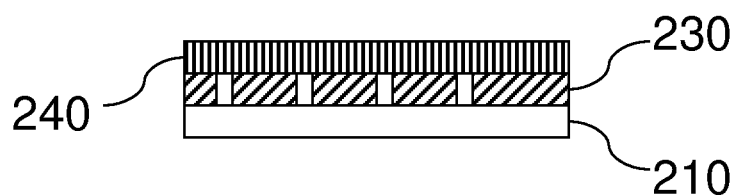
FIG. 2C

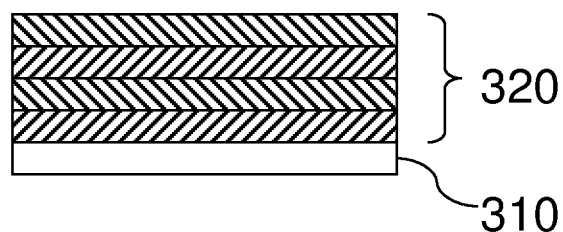
FIG. 3A
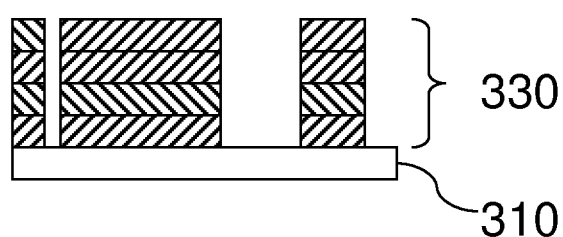
FIG. 3B

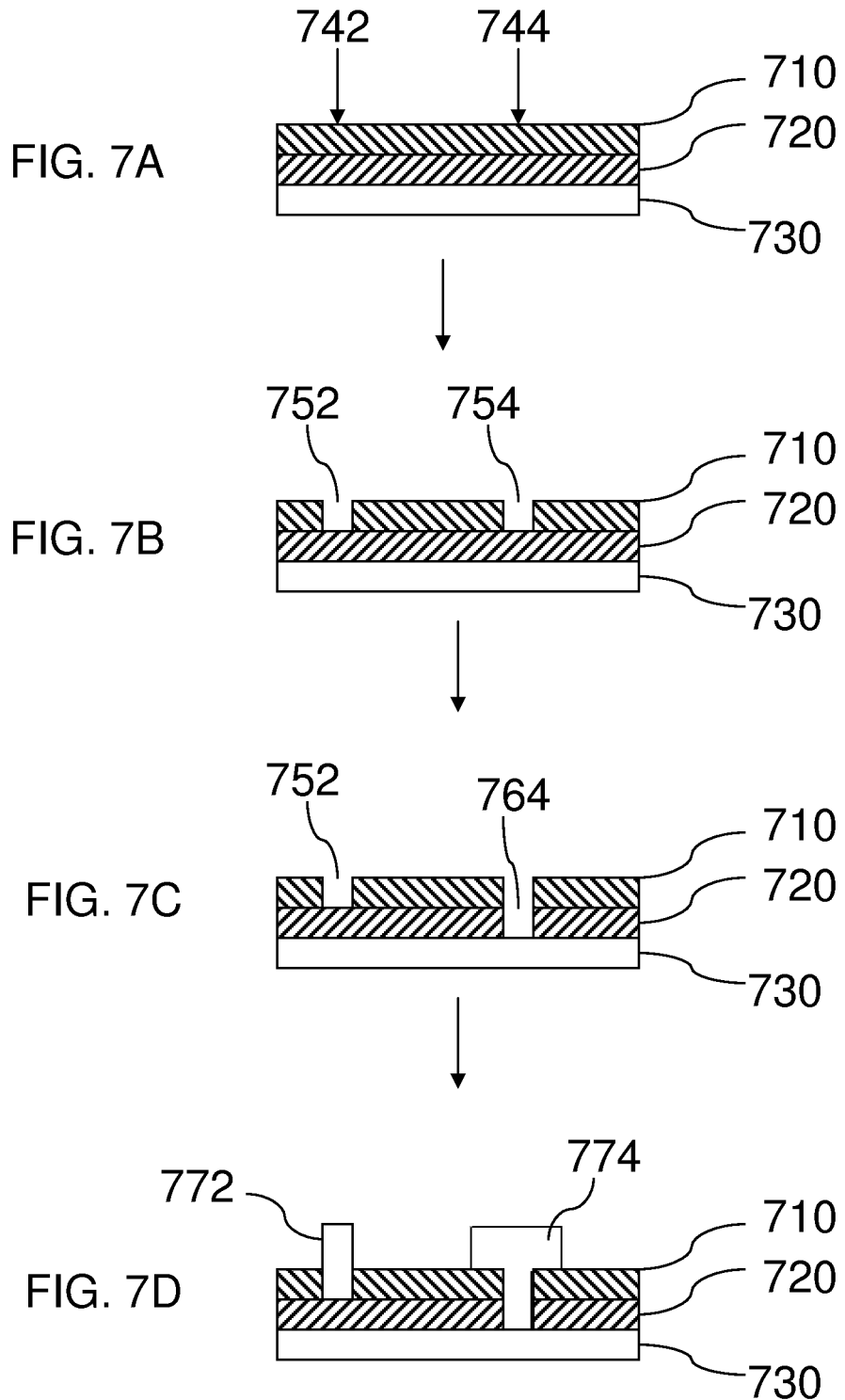

ELECTRICAL CONTACTS

PRIORITY CLAIM

This application claims priority to U.S. Provisional Application No. 60/908,873 filed on Mar. 29, 2007, the entire disclosure of which is hereby incorporated herein by reference for all purposes.

FIELD OF THE TECHNOLOGY

Certain embodiments disclosed herein relate to electrical contacts, devices including such electrical contacts and methods of producing them. More particularly, certain examples relate to an electrical contact and methods of producing them comprising exposing a layer of a disposed, first material to a second material effective to remove at least a portion of the disposed, first material.

BACKGROUND

Photovoltaic cells convert light energy into electrical energy. They may be used in many applications, for example, where electrical power from a grid is unavailable, such as in remote area power systems. Additionally, photovoltaic cells may be used in satellites, to power residential and commercial buildings, and may be used in many consumer systems (e.g., handheld calculators and wrist watches).

SUMMARY

In accordance with a first aspect, a method of producing a printed circuit board is provided. In certain examples, the method comprises disposing at least one layer on a substrate to provide a printed circuit board, exposing a portion of the disposed layer to a basic material to remove the portion of the layer to expose some portion of the substrate of the printed circuit board, and electrically coupling at least one electrical component to the exposed substrate.

In some examples, the method may further comprise configuring the basic material as an inorganic base or an organic base. In examples where the base is an inorganic base, the inorganic base may be, for example, sodium hydroxide, potassium hydroxide, barium hydroxide, cesium hydroxide, strontium hydroxide, lithium hydroxide, rubidium hydroxide and mixtures thereof. In embodiments where the base is an organic base, the organic base may be, for example, sodium methoxide, potassium tert-butoxide, sodium ethoxide, potassium ethoxide, an alkoxide and mixtures thereof. In some examples, the exposing step may comprise heating the basic material to a temperature effective to dissolve the deposited layer to provide a residue on the substrate. In other examples, the exposing step may comprise heating the basic material to a temperature effective to promote a reaction between the basic material and the deposited layer to provide a residue on the substrate. In certain examples, the exposing step may be performed at a temperature of less than 300° C. In some examples, the method may further comprise preparing a printable ink comprising the basic material dispersed in a fluid, and printing the printable ink on the deposited layer.

In accordance with another aspect, a method of producing a photovoltaic cell is disclosed. In certain examples, the method comprises disposing a silicon nitride layer on at least a portion of a silicon substrate, and exposing the silicon nitride layer to an effective amount of a basic material to remove at least a portion of the disposed silicon nitride layer to expose some portion of the silicon substrate.

In certain embodiments, the method may further comprise disposing a metal contact on the exposed silicon substrate. In other examples, the method may further comprise configuring the metal contact to include silver, gold, or mixtures thereof. In some examples, the method may further comprise configuring the basic material as an inorganic base or an organic base. In examples where the base is an inorganic base, the inorganic base may be, for example, sodium hydroxide, potassium hydroxide, barium hydroxide, cesium hydroxide, strontium hydroxide, lithium hydroxide, rubidium hydroxide and mixtures thereof. In embodiments where the base is an organic base, the organic base may be, for example, sodium methoxide, potassium tert-butoxide, sodium ethoxide, potassium ethoxide, an alkoxide and mixtures thereof. In certain examples, the exposing step may comprise heating the basic material to a temperature effective to dissolve the silicon nitride layer to provide a residue on the silicon substrate. In other examples, the exposing step may comprise heating the basic material to a temperature effective to promote a reaction between the basic material and the silicon nitride layer to provide a residue on the silicon substrate. In some embodiments, the exposing step may be performed at a temperature of less than 300° C. In certain examples, the method may further comprise preparing a printable ink comprising the basic material dispersed in a fluid, and printing the printable ink on the silicon nitride layer. In examples where a printable ink is used, the basic material may be, for example, sodium hydroxide and the fluid may be, for example, an isoparaffinic hydrocarbon. In some examples, the printable ink may comprise about 5 wt. % to about 10 wt. % sodium hydroxide.

In accordance with another aspect, a fluid cartridge is provided. In certain examples, the fluid cartridge may comprise an effective amount of a basic material to remove at least a portion of a silicon nitride material deposited on a substrate. In some examples, the basic material may be disposed in a fluid effective to render the basic material suitable for deposition on a substrate using a printer.

In accordance with an additional aspect, a kit comprising a fluid cartridge configured to be used in an ink jet printer is provided. In certain examples, the fluid cartridge may comprise an effective amount of a basic material configured to remove at least a portion of a silicon nitride material. In some examples, the basic material may be disposed in a fluid effective to render the basic material suitable for deposition on a substrate. In certain embodiments, the kit may further comprise instructions for using the fluid cartridge in an ink jet printer to produce an electrical device.

In certain examples, the kit may further comprise a second fluid cartridge configured to be used in an ink jet printer. In some examples, the second fluid cartridge may comprise silicon nitride disposed in a fluid effective to render the silicon nitride suitable for deposition on a substrate. In other examples, the kit may further comprise a third fluid cartridge configured to be used in an ink jet printer. In certain embodiments, the third fluid cartridge may comprise an ink disposed in a fluid effective to render the ink suitable for deposition on a substrate. In some examples, the ink may comprise a conductive material such as, for example, a nanoink.

Other advantages, features and aspects of the technology will be apparent to the person of ordinary skill in the art, given the benefit of certain illustrative embodiments and examples discussed below.

BRIEF DESCRIPTION OF THE FIGURES

Certain features, aspects, and examples are described in more detail below with reference to the accompanying figures in which:

FIG. 1A is a side view of a substrate including a disposed, first material and FIG. 1B is a side view of the substrate of FIG. 1A after a portion of the disposed, first material has been removed, in accordance with certain examples;

FIGS. 2A-2C show a method of producing electrical contacts in an electrical device, in accordance with certain examples;

FIGS. 3A-3B show removal of a portion of material from a plurality of layers in an electrical device, in accordance with certain examples;

FIGS. 7A-7D schematically show a method of removing a portion of a layer using a basic material and electrically coupling an electrical component to an underlying layer, in accordance with certain examples;

Figure 4:
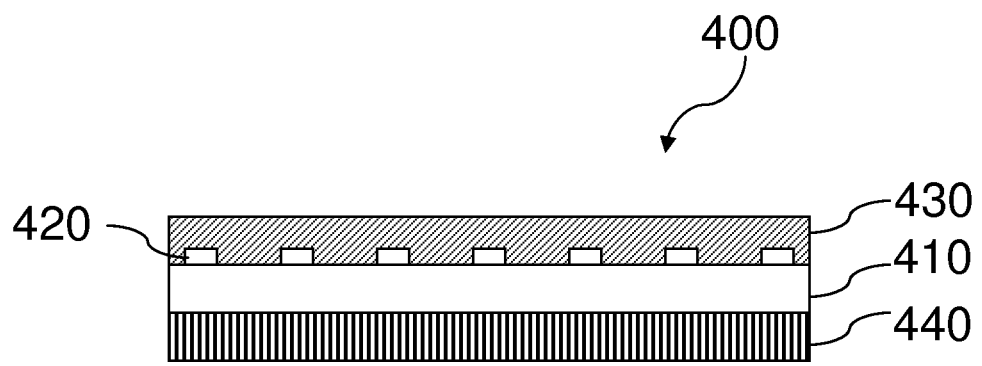
FIG. 4 is a side view of a partially assembled photovoltaic cell, in accordance with certain examples.

Certain features or aspects of the illustrative components shown in the figures may have been enlarged, distorted, altered or otherwise shown in a non-conventional manner relative to other features or components to facilitate a better understanding of the novel devices and methods disclosed herein. It will be recognized by the person of ordinary skill in the art, given the benefit of the disclosure, that the electrical devices, photovoltaic cells and the like disclosed herein may be used in any orientation relative to gravity, and suitable orientations will be readily selected by the person of ordinary skill in the art, given the benefit of this disclosure.

DETAILED DESCRIPTION

Certain examples of the devices and methods disclosed herein will be recognized by the person of ordinary skill in the art, given the benefit of this disclosure to provide more efficient electrical devices that may be produced using simpler methods with fewer steps and/or less waste. The term "disposing," as used throughout this disclosure, is intended to encompass depositing, contacting, positioning, arranging, coating, dropping, painting or otherwise application of a particular material on a desired surface or device. Materials may be disposed in numerous ways including, but not limited to, printing, ink jet printing, chemical vapor deposition technologies or other vapor deposition techniques such as physical vapor deposition, sputtering, plasma-enhanced chemical vapor deposition or the like.

In accordance with certain examples, an electrical contact on an electrical device may be produced by disposing a desired first material on a substrate and then removing at least a portion of the disposed, first material to provide the electrical contact. An illustration of this method is shown in FIG. 1A. An electrical device 100 includes a substrate 110 and a disposed layer of a first material 120 on the substrate 110. In the situation where it is desirable to remove a portion of the disposed layer 120 to provide for an electrical contact between the substrate 110 and another device, or portion thereof, a portion of the disposed layer 120 may be etched, dissolved or otherwise removed to provide a layer that allows for an electrical connection to the substrate 110. Referring to FIG. 1B, removal of at least a portion of the disposed layer 120 provides voids 135 and 140 in layer 130 where an electrical connection to the substrate 110 may be produced. In certain examples, the disposed layer 120 may be selectively removed such that a pattern is produced without having to place a mask on the disposed layer. Selective removal of the disposed first layer permits electrical coupling of the substrate 110 to another electrical device (not shown) or a component thereof.

In certain examples, the disposed first layer may be etched away or removed by selectively disposing a basic material, or a solution or dispersion including a basic material, on the disposed first layer. By disposing the basic material on selected areas, material at the selected areas may be removed without using a mask or other blocking device or film. In examples where the basic material is configured for use in ink jet printing applications, the basic material may be rapidly disposed on many selected areas in an automated manner. The composition of the basic material may be selected based on the exact composition of the layer 120 disposed on the substrate 110. For example, it is desirable to select a basic material that can dissolve or otherwise remove a portion of the layer 120 without removal of any portion of the substrate 110. As discussed further below, the basic material may be an organic base, an inorganic base or combinations thereof. In some examples, the basic material may take the form of a solution, whereas in other examples, the basic material may be dispersed, without substantial dissolution, in one or more fluids.

In accordance with certain examples, the exact type of material disposed on a substrate may vary with the intended use of the electrical device. In examples where the substrate is to be used in preparing a printed circuit board, the layer 120 may include a conductive material, a dielectric material or both. In many instances, the layer 120 may include an insulator or non-conductive material to prevent or reduce the likelihood of short circuits or unwanted electrical interference between two or more layers of an electrical device. It may be desirable, however, to electrically couple the two or more layers at certain selected areas. An example of this process is shown in FIGS. 2A-2C. Referring to FIG. 2A, a layer of material 220 is shown as having been disposed on a substrate 210. An effective amount of basic material may be disposed on the layer 220 to selectively remove portions of the layer 220 to provide a layer 230 (see FIG. 2B). Any residue that remains from removal of the selected portions of the layer 220 may be rinsed or otherwise removed from the substrate. A second substrate 240 (or a component of an electrical device as the case may be) may be disposed on the layer 230, and electrical connections may be produced through the spaces or voids produced by removal of the basic material (see FIG. 2C). In some examples, the layer disposed on the substrate may be a protective layer, e.g., a dielectric layer or an inert layer, designed to protect the underlying substrate, and components thereof, from the environment. Such protective layers may be useful, for example, where the electrical device may be exposed to harsh conditions, e.g., in aerospace applications, corrosive environments and the like, or where it is desirable, for example, to shield the substrate from one or more external conditions or from external interferences. Suitable materials will be readily selected by the person of ordinary skill in the art, given the benefit of this disclosure.

While certain examples are described herein as removing a portion of a layer disposed on the a substrate, it will be recognized by the person of ordinary skill in the art, given the benefit of this disclosure, that a portion of a multilayer device may be removed using the methods, devices and systems disclosed herein. An illustration of this feature is shown in FIGS. 3A and 3B. A plurality of layers 320 are shown as deposited on a substrate 310. A basic material may be disposed on selected areas of the plurality of layers to remove a portion of the layers to provide a layer 330. In some examples, it may be desirable to dispose the basic material two or more times on the selected areas to ensure a sufficient amount of the basic material is present to remove all the layers in a selected area to provide layer 330.

In accordance with certain examples, the exact type of electrical device that may be produced using the methods disclosed herein is not limited. In particular, any electrical device that includes one or more electrical contacts between two areas or substrates may benefit from the methods, devices and systems disclosed herein. Illustrative electrical devices include, but are not limited to, printed circuit boards, cellular phones, photovoltaic cells, solar panels, fiber optic communication devices and other electrical devices that include two or more layers of materials. A particular electrical device of interest is a photovoltaic cell, as described in more detail below. Generally, photovoltaic cells may include a first side and a second side. The first side may include a light absorbing material to absorb photons from the sun, which causes ejection of electrons out of a valence band and into a conduction band. This process permits harnessing of the electrons energy to provide an electric current. The electric current may be passed through a metal contact or concentrated into a wire or other circuit and used to power one or more devices electrically coupled to the wire or circuit.

In accordance with certain embodiments, a metal contact may be provided to a second side of a photovoltaic cell. In existing methods, a patterned contact or a grid-like contact (referred to in certain instances herein as a "contact grid") may be applied to a front surface of the photovoltaic cell over an antireflection coating, as discussed below in more detail. To provide electrical contact between a contact grid and the light absorbing material of a photovoltaic cell, the contact grid may be fixed at high temperatures (e.g., 600° C.-900° C.) or sintered. Additionally, to produce the contact grid, the contact may be applied in the form of a solution or dispersion that contains glass frit which has the drawback of limiting the conductivity of the contact grid. The glass frit may also cause complications if the process is not controlled tightly. For example, the glass frit may etch not only the antireflection coating, but also the substrate layer, thus damaging the photovoltaic cell. Certain embodiments of the methods and devices disclosed herein are designed to overcome at least some of these drawbacks in the production of photovoltaic cells.

In certain examples, an antireflection coating, as mentioned above, may be applied to at least one side, or some portion thereof, of a photovoltaic cell to reduce the reflectance of light incident on the photovoltaic cell, and increase the light trapping ability of the photovoltaic cell to increase its overall efficiency. In some examples, the antireflection coating may include a material such as silicon nitride or titanium dioxide. In a typical silicon photovoltaic cell, a dielectric layer of silicon nitride may overlay or cover some portion or all of a conductive layer of silicon. To collect the photons to convert them to electrical energy, it may be desirable to etch through the silicon nitride layer, or to remove at least some portion of the silicon nitride layer, to expose selected areas of the silicon layer and the electron collecting metal contact.

Certain embodiments disclosed herein provide low temperature methods of producing electrical devices such as, for example, photovoltaic cells. As used herein "low temperature" refers to a temperature less than about 500° C., and more particularly low temperature refers to a temperature of about 250° C. to about 300° C. While the layer or layers of material may be removed at a low temperature, during other processing steps used to prepare the electrical device, temperatures below, above or within the low temperature range may be used, e.g., the entire structure may be sintered at high temperature after removal of selected areas with a basic material. In some examples, the low temperature removal of selected area permits use of the materials with ink jet printing devices and systems. In comparison, some existing methods of producing photovoltaic cells use masks and high temperatures. A mask is used to screen print a silver containing contact over the silicon nitride layer with a paste that contains a certain amount of glass frit. The paste may be heated to high temperatures (e.g., 600-900° C.) to dissolve the silicon nitride to provide a contact between the silver and silicon through the silicon nitride layer. In certain embodiments described herein, photovoltaic cells may be produced without using masking techniques or heating to high temperatures, which may damage the components of the photovoltaic cell.

In accordance with certain embodiments, FIG. 4 illustrates a partially assembled photovoltaic cell 400. The photovoltaic cell 400 comprises a substrate 410 configured to absorb light and to eject electrons in response to suitable wavelengths of the absorbed light. The substrate 410 may also be configured to pass the ejected electrons through a metal contact and to a wire or other circuit where the electric current may be used to power one or more devices electrically coupled to the photovoltaic cell. In a typical configuration, a contact grid 420 may be coupled to the substrate 410 and may partially cover the substrate 410. In some examples, a layer of an antireflection material 430 may be disposed on the contact grid 420 and the substrate 410. In other examples, a back contact 440 may cover or overlay, at least partially, a back surface of the substrate 410.

Figure 5:
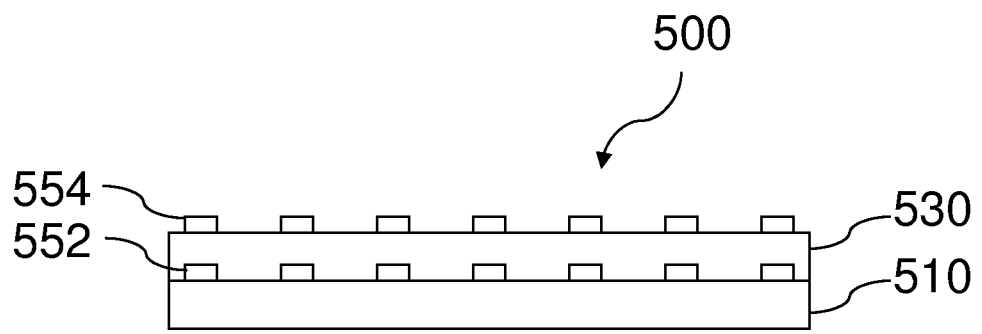
FIG. 5 is another side view of a partially assembled photovoltaic cell, in accordance with certain examples.

In certain embodiments and referring to FIG. 5, a photovoltaic cell 500 may include first and second electrical contacts 552 and 554, respectively, in a contact grid 530. In certain examples, at least one of the electrical contacts 552 and 454 may be operative to receive electrons, e.g., function as a collector of electrons. The contacts may be configured to transfer the electrons from the photovoltaic cell 500. For example, when an external load is connected to the first contact 552 and the second contact 554, an electric current may flow through the photovoltaic cell 500 and through the external load. The contacts may cover or be electrically coupled to at least a portion of a light absorbing material on the substrate 510 such that electrons ejected by the substrate 510 may be received by the contacts. In certain embodiments, at least one contact may cover one entire side of the substrate 510, e.g., the contact is generally planar and is electrically coupled to the substrate 510 at one or more sites. In another example, at least one of the contacts may cover the light absorbing material in a pattern, for example, a grid pattern. In particular, the methods disclosed herein that use a basic material to selectively remove a layer disposed on a substrate may be used to provide a selected pattern which may be linear, curvilinear, circular, square, gridded, or may take other shapes and forms when viewed from the top of the device.

In certain examples, the exact type of material included in the substrate of the photovoltaic cell may vary depending on the exact wavelength(s) of light that the substrate is intended to absorb. The materials included in the substrate determine, at least in part, the work function of the substrate which determines what wavelength of light has enough energy to eject one or more electrons from the substrate. In certain embodiments, the substrate may include silicon, cadmium telluride, copper indium selenide/sulfide, CIGS (copper indium gallium diselenide), light absorbing dyes, organic semiconductors, nanomaterials, titanium dioxide, indium tin oxide (ITO), glass and the like. Examples of suitable types of silicon that may be used include, but are not limited to, amorphous silicon, polycrystalline silicon, micro-crystalline silicon, nano-crystalline silicon, thin film crystalline silicon on glass (CSG), and materials providing similar physical properties.

In certain examples, the materials used for the electrical contacts may include a conductive metal or polymer or may be, or include, a metallo-organic solution, ink or paste. For example, at least one metal contact may include silver, gold, conductive polymers such as, for example, polyaniline, polyacetylene, polypyrrole (or derivatives of any of these polymers) or any other suitable metal or conductive material that can pass or carry an electric charge or current. Additional suitable conductive materials for use in providing electrical contacts, will be selected by a person of ordinary skill in the art, given the benefit of this disclosure. A particularly useful conductive material suitable for use as an ink, for example, is described in commonly assigned U.S. patent application Ser. No. 11/462,089 filed on Aug. 3, 2006 and entitled "PARTICLES AND INKS AND FILMS USING THEM," the entire disclosure of which is hereby incorporated herein by reference for all purposes. In some examples, at least one conductive material may be disposed on a light absorbing material in a photovoltaic cell. In other examples, at least one metal contact may also be disposed on a side opposite the side of the substrate which is exposed to a light source. The metal contact layer may have a thickness of about 1-3 microns. The substrate may have a thickness of about 50-300 microns. As discussed above, the contacts provide a path to carry an electric current within the photovoltaic cell or to a device electrically coupled to the photovoltaic cell.

In accordance with certain examples, the various layers of a photovoltaic cell typically provide different functions that collectively impart an electric current generation as light energy is converted to current by the photovoltaic cell. In examples where an anti-reflection coating is used in a photovoltaic cell, the anti-reflection coating is operative to reduce the amount of light energy that is reflected away from the photovoltaic cell to increase the overall efficiency of the photovoltaic cell. Illustrative materials for use as an anti-reflection coating include, but are not limited to, titanium dioxide, silicon oxynitride, magnesium difluoride ($MgF_2$), thin films and the like. One particularly useful material for use in an anti-reflection coating is silicon nitride. Silicon nitride has excellent surface passivation qualities thus preventing carrier recombination at the surface of the photovoltaic cell. The anti-reflection coatings may be disposed on the substrate in many different manners and illustrative methods include, but are not limited to, vapor deposition, plasma-enhanced vapor deposition and the like. The exact thickness of the anti-reflection coating may vary depending on the type of material used in the anti-reflection coating, and illustrative thicknesses include, but are not limited to about 30 nm to about 500 nm, more particularly about 50 nm to about 100 nm. In embodiments where silicon nitride is used as an anti-reflection coating, the thickness of the silicon nitride layer may vary from about 30 nm to about 100 nm, more particularly 50 nm to about 80 nm. In some examples, the anti-reflection coating is present at an effective thickness to reduce reflections by at least 90% as compared to a similar device lacking the anti-reflection coating.

In accordance with certain examples, an effective amount of a basic material may be disposed on a layer of the device to selectively remove portions of the layer. As used herein, "effective amount" refers to an amount or concentration that is capable of removing, e.g., dissolving, etching, chemically reacting to form a residue, etc., some portion of a layer after a selected incubation period. In some examples, the basic material may remove a portion of a top layer to expose an underlying layer. For example, it may be desirable to remove a portion of a top layer so that an electrical connection between an underlying layer and another device may be produced. Such removal is particularly desirable where the top layer is, or includes, a non-conductive material, such as an insulator, anti-reflection coating or the like. The exact incubation period or time used may vary depending on the selected materials and the processing temperature, and illustrative incubation times are between about 30 seconds to about 5 minutes, e.g., about 60 seconds to about 3 minutes.

In certain examples, the basic material may be effective to dissolve a material in a layer. Dissolution may be accomplished, for example, by deprotonation of the material and subsequent washing with a desired fluid or solvent. Deprotonation of the material may impart a charge to the material rendering it soluble in the fluid or solvent. In some examples, the fluid that the basic material is suspended or dissolved in may also serve to wash away the deprotonated material in a single step. In certain examples, a secondary fluid or solvent may be added to promote mixing of the basic material with the material of the layer.

In other examples, the basic material may result in a chemical reaction that renders the material susceptible to being removed. For example, the anions of the basic material may add to a group, or substitute for a group, of the material. Such chemical reaction may change the physical properties of the material and render it suitable for removal by, for example, washing with a fluid or solvent. In certain examples, to facilitate a chemical reaction, the material with disposed basic material may be heated, e.g., in an oven, to increase the rate at which the reaction occurs. In some examples, catalysts, accelerators and the like may also be added to increase the overall reaction rate. In addition, a secondary fluid or solvent may be added to promote mixing of the basic material with the material of the layer.

In some examples, the basic material may be effective to disrupt physical or chemical interactions that permit packing of the material to form a layer. For example, the anions of the basic material may act to disrupt hydrogen bonding, salt bridges, van der Waals' interactions, and the like which permit packing of the material into the layer. Disruption of these interactions may permit removal of the layer by washing the material from the layer using a fluid or solvent.

In accordance with certain embodiments, the basic material may be any material whose pH is greater than 7. The term "basic material" is intended to include weak and strong bases. In certain examples, the basic material may be any material whose dissociation constant $pK_b$ is less than or equal to about 5, more particularly, the $pK_b$ is less than or equal to about 1, 0.5 or even less than zero. The basic material may be an inorganic base, an organic base or combinations thereof. In some examples, the basic material may be generated in situ by reaction of two or more species that form a hydroxide group or an alkoxy anion. In certain examples, the basic material may be produced by shifting of an equilibrium state to produce increased amounts of a hydroxide or an alkoxy anion. In addition, consumption of hydroxides or alkoxy anions may act to shift the equilibrium state further as described by the well-known Le Chatelier's principle.

In certain examples, the basic material may be an inorganic base. Illustrative strong inorganic bases, e.g., those bases formed by complete dissociation to hydroxide, include, but are not limited to, an alkali metal hydroxide, such as potassium hydroxide, sodium hydroxide, lithium hydroxide or mixtures thereof. In other examples, the strong base may be an alkaline metal hydroxide such as, for example, calcium hydroxide, strontium hydroxide or barium hydroxide. In yet other examples, a weak inorganic base, e.g., a base formed by partial dissociation of a species into a hydroxide group, may be used. Illustrative weak inorganic bases include, but are not limited to, ammonia. Additional strong and weak inorganic bases for use in the methods and devices disclosed herein will be readily selected by the person of ordinary skill in the art, given the benefit of this disclosure. In some examples, a combination of a strong inorganic base (e.g., an alkali or alkaline metal hydroxide) and a weak inorganic base may be used.

In some examples, the basic material may be an organic base. The organic base may be a strong or weak organic base. Illustrative strong organic bases include, but are not limited to sodium methoxide, potassium tert-butoxide, sodium ethoxide, potassium ethoxide, an alkoxide, or mixtures thereof. In some examples, a Group I salt of a carbanion, amide, or hydride, e.g., butyl lithium (n-BuLi), lithium diisopropylamide (LDA), sodium amide ($NaNH_2$), and sodium hydride (NaH), may be used as a strong base. In examples where a weak base is used, the weak base may be, for example, aniline, ethylamine, hydroxylamine, methylamine, pyridine, alanine or other organic materials that can dissociate to form a hydroxide group. Additional strong and weak organic bases for use in the methods and devices disclosed herein will be readily selected by the person of ordinary skill in the art, given the benefit of this disclosure. In some examples, a combination of a strong organic base and a weak organic base may be used. In yet other examples, an inorganic base, e.g., strong or weak, may be mixed with an organic base, e.g., strong or weak, and the resulting mixture disposed on a desired layer. In other examples, different basic materials may be disposed at different areas on a layer to remove different amounts or to remove the same amount of material at a different rate.

In accordance with certain examples, the basic material may be dissolved, dispersed or otherwise suspended in a suitable fluid to facilitate disposal of the basic material on a substrate. In embodiments where the basic material is dissolved in the substrate, a selected amount of basic material may be added to the fluid to provide a desired concentration or the basic material may be added in excess to the fluid such that the fluid is saturated with the basic material. The exact type of fluid used depends, at least in part, on the chemical properties of the basic material. In embodiments where an inorganic base is used, water or an aqueous solution may be used to dissolve the basic material. In embodiments where an organic base is used, water, methanol, ethanol or other alcohols, ethers, and aqueous solutions thereof may be used to dissolve the basic material. Where the basic material is dispersed in a fluid, the basic material is substantially insoluble in the dispersing fluid, and the dispersing fluid functions as a carrier for the basic material. In embodiments where an inorganic or an organic base is dispersed in a fluid, a substantially non-polar fluid such as benzene, toluene, hexane and the like may be used as a dispersing fluid. In examples where the basic material is dispersed in a fluid, it may be desirable to add water or an aqueous solution to the basic material after it has been disposed on a layer and after the dispersing fluid is removed to allow dissociation of the basic material into hydroxide ions. In the alternative, water vapor may be introduced by passing a stream of humidified air over the deposited basic material to promote dissociation of the basic material. Additional fluids and materials for use with the basic material will be readily selected by the person of ordinary skill in the art, given the benefit of this disclosure.

Figure 6A:
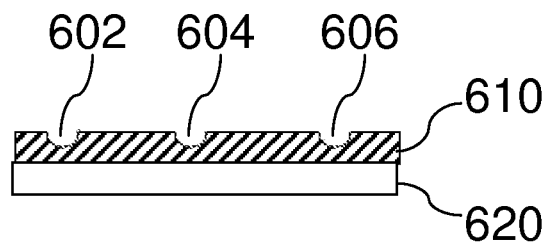
FIGS. 6A-6B schematically show a method of removing a portion of a layer using a basic material, in accordance with certain examples.
Figure 6B:
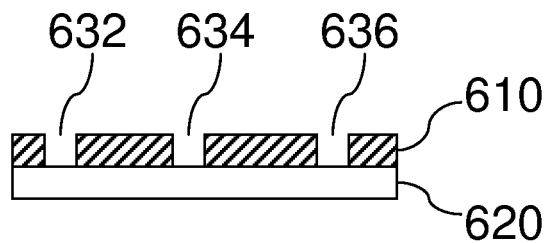

In accordance with certain embodiments, the basic material may be disposed on a layer to remove a portion of the layer. An illustration of this process is shown in FIGS. 6A-6B. Referring to FIG. 6A, a basic material has been disposed in three areas 602, 604, and 606 on a layer 610, which itself is disposed on a substrate 620. After deposition of the basic material, the basic material may incubate for a selected period at a selected temperature to provide for removal of a portion of layer 610 (see FIG. 6B). The exact incubation period and temperature may vary depending on the selected basic material used. In certain examples, the basic solution is disposed on the layer and allowed to remain until the fluid or solution that is used to disperse or dissolve the basic material evaporates. In some examples, such evaporation may be assisted by passing a vapor stream of, for example, room temperature air, heated air, dried air or the like across the surface of layer 610. Similarly, the incubation temperature may vary from about room temperature, e.g., about 20° C., to about 300° C. The basic material is effective to create voids 632, 634 and 636 in the layer 610 such that portions of the substrate 620 are exposed. Such a process exposes selected portions of the substrate 620 to permit electrical coupling to those exposed areas.

In certain examples, the basic material may be heated to a temperature above room temperature prior to deposition on the substrate. Such heating may permit removal of selected portions of the layer more rapidly than by using the basic material at room temperature. The exact temperature used depends, at least in part, on the fluid or solvent used to disperse the basic material. In particular, the basic material should not be heated to such a degree that the fluid or solvent may evaporate prior to deposition on a layer. In some examples, however, the fluid may be boiled and the boiling fluid may be disposed on the layer. Illustrative deposition temperatures include, but are not limited to, about 20° C. to about 70° C., more particularly about 25° C. to about 50° C. Heating of the basic solution may be particularly desirable where dissolution of the basic material is an endothermic process.

In accordance with certain examples, the exact amount of basic material disposed on the layer 610 may vary depending on the thickness of the layer and the particular material in the layer. In some examples, an effective amount of the basic material may be deposited on the layer 610. An "effective amount" of material is an amount that can remove a selected area of the layer 610 to expose the substrate 620. The effective amount depends, at least in part, on the thickness of the layer 610, the concentration of the basic material and the incubation period and temperature. In examples where the basic material is deposited in an automated fashion, the volume of basic material disposed on each selected area of the layer may vary from about 0.05 mL to about 1 mL, more particularly about 0.1 mL to about 0.2 mL. In instances where a substantial portion of the layer is to be removed, the volume disposed on the layer may be significantly larger.

In accordance with certain examples, deposition of the basic material on a device may be performed manually or in an automated fashion, e.g., by ink jet printing, automatic dropping or pipetting or the like. In some examples, the basic material may be deposited once in selected areas, whereas in other examples, the basic material may be deposited numerous times in the same area. After deposition, it may be desirable to spread the basic material around the area proximate to the deposition site. Such spreading may be accomplished by rotating the device in three dimensions to permit fluid flow around and into a desired area. Alternatively, the basic material may be dispersed in or around an area using an air stream to spread the fluid out in a desired direction or pattern. In some examples, an excess of basic material may be deposited to permit the basic material to spread out over a large area. Suitable methods and devices to spread the basic material over a desired area will be selected by the person of ordinary skill in the art, given the benefit of this disclosure.

In accordance with certain embodiments, the basic material may be dispersed or otherwise suspended in a fluid to provide a printable paste. In some examples, the fluid may solubilize the basic material or may be effective to disperse the basic material without substantial dissolution. The fluid may be of high viscosity, for example, between about 10 centipoise and about 700 centipoise. In certain embodiments, the viscosity may be in the range of about 10 centipoise to about 20 centipoise. The basic material may be added in amounts such that the paste may have a concentration of greater than 5-10 weight percent of basic material based on the weight of 50-60 weight percent. In certain examples, this dispersion may be used as a paste for screen or stencil printing.

In accordance with certain examples, after the basic material is disposed in a desired area or areas, the basic material may be allowed to dissolve or react with the layer to remove portions of the layer. As discussed above, the basic material acts to remove selected portions of the layer of material to expose the underlying substrate. The overall device may be heated with the basic material disposed thereon to facilitate removal of the layer overlying the substrate. After exposition of the substrate, the exposed area may be washed to remove any remaining basic material. Washing may remove any residual basic material to prevent further reaction or to avoid any unwanted reaction of the basic material with the substrate. In instances where the basic material leaves a powdery or flocculent residue, the residue may be removed by washing or by using an air stream to blow off the residue. In some examples, the area from which the residue is removed may be washed, dried or subjected to one or more additional treatment steps to prepare the area for further processing. Such additional treatments steps may vary depending on the intended use of the device.

In accordance with certain embodiments, in producing an electrical device using the methods disclosed herein, a layer of material is first disposed on a substrate. As discussed herein, the layer may be disposed in numerous manners including, but not limited to, painting, spraying, rolling, vapor deposition and other known methods of applying one material onto another. After deposition of the layer, the resulting composite structure may be subjected to one or more treatment steps prior to removal of selected areas using the basic material. Illustrative treatment steps include, but are not limited to, heating, sintering, washing, drying, baking, solder deposition and/or reflow and other steps that may be performed during production of an electrical device.

In certain examples, the methods disclosed herein may be used to prepare a printed circuit board. In some examples, the printed circuit board may include a plurality of layers some of which (or each of which in certain cases) may include one or more electrical paths. It may be desirable to expose one or more of the underlying layers to permit electrical coupling of a device, e.g., a memory chip, a grid array or an electrical connector, to the exposed layer. An illustration of this process is shown in FIGS. 7A-7C. Referring to FIG. 7A, a printed circuit board 700 comprises a plurality of layers 710, 720 and 730. A basic material may be disposed at sites 742 and 744 to remove a portion of layer 710 (see FIG. 7B) to provide an exposed area 752 and 754. Additional basic material may be disposed at are 754 to remove a portion of layer 720 to provide exposed area 764 (see FIG. 7C). Electrical components 772 and 774 may be electrically coupled to the exposed areas 752 and 764, as shown in FIG. 7D. Coupling of the electrical components 772 and 774 may be performed using well-known techniques such as, for example, soldering.

In accordance with some embodiments, removing selected areas of the layers 710 and 720 may be performed in an environment at less than 300° C. For example, the temperature may be between about 250° C. to about 270° C. In other examples, the printed circuit board may be heated to less than 300° C., or more preferably between about 250° C. to about 270° C. In certain examples, the printed circuit board may be heated prior to or during the step of exposing the layers to the basic material.

In accordance with certain examples, the methods disclosed herein are also particularly useful in the production of photovoltaic or solar cells. A typical photovoltaic cell may include multiple layers one of which may be an anti-reflection coating. As many of the anti-reflection coatings are dielectric material or are non-conductive, it may be desirable to remove a portion of the anti-reflection coating to permit electrical coupling to an underlying layer. A basic material may be deposited on the anti-reflection coating to remove a selected portion of the anti-reflection coating and expose an underlying layer, such as a silicon substrate. In some examples, the basic material may be heated to a temperature that initiates a reaction between the basic material and the anti-reflection coating. The basic material may be heated to a temperature so that it at least partially removes the anti-reflection coating. Removal of the antireflection coating may comprise dissolving, lifting, taking away, pushing aside, or otherwise eliminating, either partially or fully, the layer above an underlying layer. Removal of the anti-reflection coating may provide a residue, which can be washed or otherwise blown away, as discussed herein.

In accordance with some embodiments, removing selected areas of the anti-reflection coating may be performed in an environment at less than 300° C. For example, the temperature may be between about 250° C. to about 270° C. In other examples, the solar cell may be heated to less than 300° C., or more preferably between about 250° C. to about 270° C. In certain examples, the solar cell may be heated prior to or during the step of exposing the layers to the basic material. One or more additional treatment steps may also be performed post-removal of selected areas of the anti-reflection coating, and such additional treatment steps include, but are not limited to, polishing, blowing of air, vacuuming, aspiration, sintering, heating, drying, soldering and the like.

In accordance with certain examples, a method of producing a photovoltaic cell typically comprises depositing an anti-reflection coating on a silicon substrate. Such deposition of the anti-reflection coating may be performed using numerous methods including, but not limited to, vapor deposition, painting, spin coating, brushing and the like. Post-deposition of the anti-reflection coating, an effective amount of a basic material may be disposed on the composite device to remove selected portions of the disposed anti-reflection coating and to expose the underlying silicon substrate. Exposition of the underlying silicon substrate permits electrical coupling to the silicon substrate, which may be desirable to pass any generated current to a device electrically coupled to the photovoltaic cell.

In accordance with certain embodiments, one or more masks may be used with the methods and devices disclosed herein. While use of the basic material to remove selected areas of a layer may be performed without a mask, it may be desirable to use a mask in the removal step, or in other processing steps. Suitable types of masks and methods of using them will be readily selected by the person of ordinary skill in the art, given the benefit of this disclosure.

In accordance with certain embodiments, a kit for producing an electrical device is provided. In some examples, the kit may be provided to assist in deposition of a layer or coating to produce the electrical device. For example, the kit may include a material to be deposited as one layer, or some portion thereof, on a portion of a substrate. In certain examples, the kit may be provided to deposit a metal contact onto a portion of an electrical device. In some examples, the kit may be provided to deposit a metal contact onto a portion of an electrical device in the form of a pattern or grid. In other examples, the kit may be configured with a material to deposit an anti-reflection coating on at least a portion of a photovoltaic cell substrate, e.g., a silicon substrate. In some examples, the kit may include one or more additional material to be depositing on the substrate. In certain examples, the kit may include one or more electrical components to be coupled to the substrate after a selected area of an overlying layer has been removed. Additional components for inclusion in a kit for producing an electrical device will be readily selected by the person of ordinary skill in the art, given the benefit of this disclosure.

In accordance with certain embodiments, a fluid cartridge comprising a basic material is provided. In some examples, the fluid cartridge may be configured to be placed into a printing system, e.g., an ink jet printing system or the like, such that the basic material may be disposed through one or more print heads at selected sites on a surface. In certain examples, a fluid cartridge that comprises a material to be disposed as a layer on a substrate may also be used with the fluid cartridge that includes the basic material. The use of the two fluid cartridges permits deposition of a layer on substrate followed by selective removal of the layer by depositing the basic material on the selected areas, which permits automated assembly of the electrical device. In some examples, at least one of the fluid cartridges may include a material that can function as an anti-reflection coating after deposition on a substrate.

In accordance with certain embodiments, a system comprising a printer configured to deposit at least one layer of an electrical device and a fluid cartridge configured to be placed in the printer and comprising a basic material is provided. In certain examples, the fluid cartridge may also comprise a basic material in a fluid effective to render the material suitable for deposition on a substrate. In some examples, a fluid cartridge that includes a material that can function as an anti-reflection coating after deposition on a substrate may be used in the system. In certain examples, the system may be coupled to a computer such that desired printing patterns or shapes may be selected through a graphical user interface, and the selected printing patterns or shapes may be implemented by sending a suitable signal from the computer to the printer.

Certain specific examples are described below to further illustrate some of the novel features of the technology described herein.

Example 1

Figures 8A, 8B, 8C, 8D:
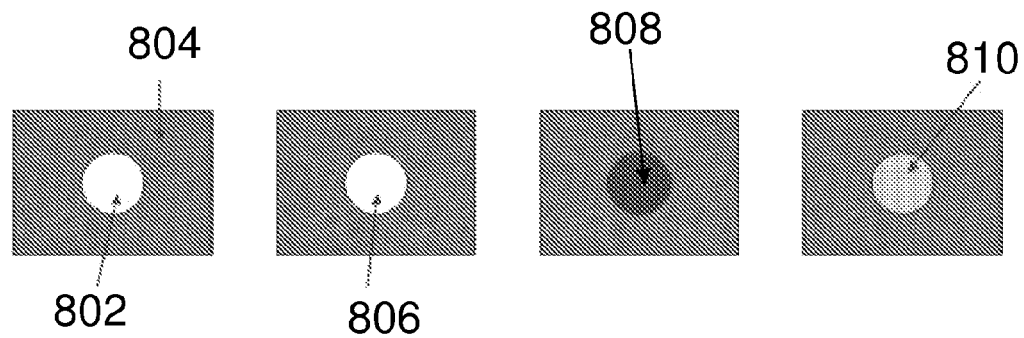
FIGS. 8A-8D are photographs showing removal of a portion of a silicon nitride layer with a basic material, in accordance with certain examples.

2 grams of sodium hydroxide was dissolved in 20 mL of a 1:2 water/ethanol mixture. Referring to FIG. 8A, the sodium hydroxide solution was deposited on a selected area 802 of a silicon nitride layer 804 over the silicon substrate. The sodium hydroxide solution was allowed to dry in air or on a hot plate at a temperature of 70° C. After drying a light colored film 806, representative of solid NaOH, formed on the silicon nitride layer 804 (FIG. 8B).

The substrate was subsequently heated at 250-270° C., for example, on a hot plate or in an oven. During heating, the light-colored film darkened first to a black color 808 (FIG. 8C) and then lightened to a gray color 810 (FIG. 8D). Upon appearance of the gray color 810, the incubation was halted. The total incubation time was about 30-60 seconds. The gray residue was removed by rinsing with warm water.

Example 2

Figure 9:
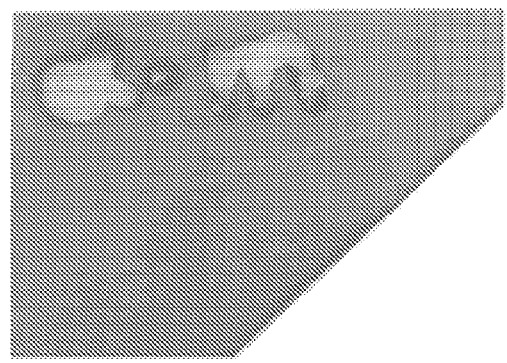
FIG. 9 is a photograph showing a pattern produced by selective removal of a silicon nitride layer, in accordance with certain examples.

The process described in Example 1 was used to provide a selected pattern on a substrate. The basic material described in Example 1 was deposited using a ball pen onto a silicon substrate that included a silicon nitride layer overlying the silicon substrate. After reaction of the basic material, a pattern that included the Greek symbol alpha and the letter "m" for ALPHA® METALS was observed (see FIG. 9).

Example 3

Figure 10:
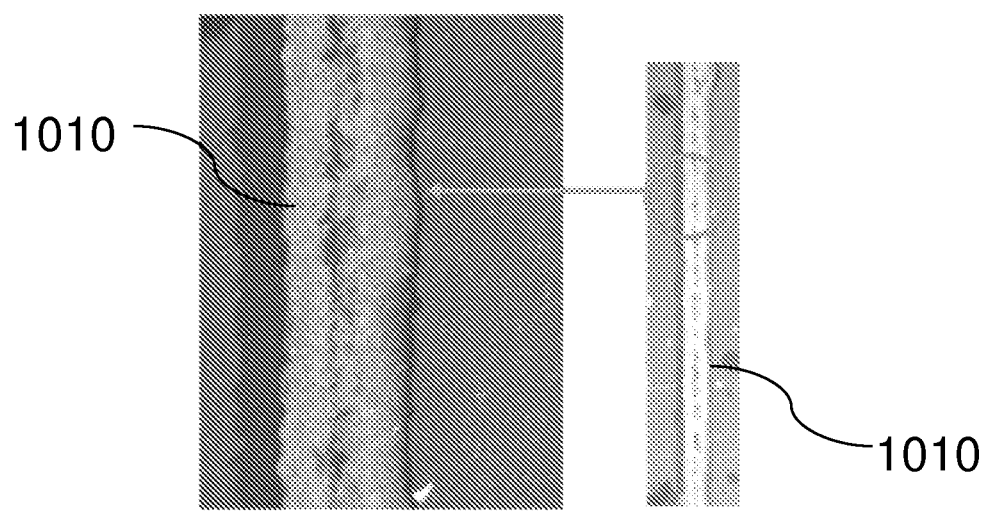
FIG. 10 is a photograph showing a line produced by removing a portion of a silicon nitride layer over a silicon substrate, in accordance with certain examples.

The basic material of Example 1 was used in an ink jet printing process to remove a linear portion of a silicon nitride layer on a silicon substrate. The ink jet printer used was a Dimatix material inkjet printer, printing at 32° C., and a printing voltage of 24V. After the basic material was deposited on the silicon nitride layer, the total incubation time was about 30-60 seconds. The resulting line 1010 is shown in FIG. 10.

Example 4

To reduce spread of the basic material and improve resolution of the removed material, fine NaOH powder may be dispersed in a non-solvent fluid such as Isopar with the help of dispersing agents such as Disperbyk® 107 and 108 (Byk-Gulden Lomberg Chemische Fabrik Gmbh Corporation). A typical weight concentration of the NaOH powder is about 5-10% by weight. Such dispersion may be used as an ink for ink jetting and removing fine patterns in silicon nitride.

Example 5

A fine basic material may be dispersed in a high viscosity fluid, e.g., 50 centipoise or higher, at a high concentration, e.g., 40% by weight. The resulting dispersion provides a paste suitable for screen or stencil printing.

Example 6

Sodium methoxide may be produced in situ by placing solid sodium in methanol. The produced sodium methoxide may be used in place of (or with) the NaOH solution in Example 1.

Example 7

Potassium tert-butoxide may be produced in situ by placing solid potassium in tert-butyl alcohol. The produced potassium tert-butoxide may be used in place of (or with) the NaOH solution in Example 1.

Example 8

Sodium ethoxide may be produced in situ by placing solid sodium in ethanol. The produced sodium ethoxide may be used in place of (or with) the NaOH solution described in Example 1.

Example 9

Potassium ethoxide may be produced in situ by placing solid potassium in ethanol. The produced potassium ethoxide may be used in place of (or with) the NaOH solution described in Example 1.

Example 10

A solid alkoxide such as a solid form of any one or more of the alkoxides disclosed in Example 6-9, may be dispersed in a fluid optionally with the aid of one or more dispersing agents. The dispersion may be used as an ink for ink jetting and removal of silicon nitride.

Although the electrical devices, photovoltaic cells and methods of making them have been described above in terms of certain examples and embodiments, various alterations, modifications, substitutions, additions and improvements will be readily apparent to the person of ordinary skill in the art, given the benefit of the disclosure. Such alterations, modifications, substitutions, additions and improvements are intended to be within the scope and spirit of the electrical contacts disclosed here. It is also intended that the indefinite articles "a" and "an," as used above and in the appended claims, mean one or more of the articles which they modify, and that the terms "include," "including" and "having" are interchangeable with the open ended term "comprising." Only the transitional phrases "consisting of" and "consisting essentially of," are closed or semi-closed transitional phrase, respectively with respect to the claims.

What is claimed is:

1. A method of producing a photovoltaic cell, comprising:
   disposing a silicon nitride layer on at least a portion of a silicon substrate;
   selectively printing a printable ink comprising an effective amount of a basic material dispersed in a fluid onto a portion of the silicon nitride layer;
   exposing the portion of the silicon nitride layer to the effective amount of basic material;
   heating the silicon nitride layer and the printed ink at a temperature of about 250° C. to about 300° C. to remove the portion of the silicon nitride layer with the basic material to expose some underlying portion of the silicon substrate without using a mask on the silicon nitride layer; and
   electrically coupling at least one electrical component to the exposed silicon substrate to produce the photovoltaic cell.

2. The method of claim 1, wherein electrically coupling at least one electrical component to the exposed silicon substrate comprises disposing a metal contact on the exposed silicon substrate.

3. The method of claim 2, further comprising configuring the metal contact to include silver, gold, or mixtures thereof.

4. The method of claim 1, in which the exposing step comprises heating the basic material to a temperature effective to dissolve the silicon nitride layer to provide a residue on the silicon substrate.

5. The method of claim 1, in which the exposing step comprises heating the basic material to a temperature effective to promote a reaction between the basic material and the silicon nitride layer to provide a residue on the silicon substrate.

6. The method of claim 1, further comprising preparing the ink comprising the basic material dispersed in a fluid.

7. The method of claim 6, in which the basic material is sodium hydroxide and the fluid is an isoparaffinic hydrocarbon.

8. The method of claim 6, in which the printable ink comprises about 5 wt. % to about 10 wt. % sodium hydroxide.

9. The method of claim 1, wherein the exposing step involves incubation for a duration of between about 30 seconds and 5 minutes.

10. The method of claim 9, wherein the exposing step involves incubation for a duration of between about 60 seconds and 3 minutes.

11. The method of claim 1, wherein the ink has a viscosity of between about 10 and 700 centipoise.

12. The method of claim 11, wherein the ink has a viscosity of between about 10 and 20 centipoise.

13. The method of claim 1, wherein the exposing step temperature is in a range of about 250° C. to about 270° C.

14. The method of claim 1, wherein the basic material in the ink has a concentration of greater than about 5 to 10 weight percent.

15. The method of claim 1, further comprising heating the ink prior to printing.

16. The method of claim 1, wherein the ink is printed in a selected pattern on the silicon nitride layer.

* * * * *